United States Patent [19]

Nakamura et al.

[11] Patent Number: 4,792,514
[45] Date of Patent: Dec. 20, 1988

[54] LIGHT-SENSITIVE MATERIAL

[75] Inventors: Taku Nakamura; Kozo Sato, both of Kanagawa, Japan

[73] Assignee: Fuji Photo Film Co., Ltd., Kanagawa, Japan

[21] Appl. No.: 917,744

[22] Filed: Oct. 10, 1986

[30] Foreign Application Priority Data

Oct. 11, 1985 [JP] Japan .............................. 60-226084

[51] Int. Cl.$^4$ .......................... G03C 1/06; G03C 1/40
[52] U.S. Cl. .................................... 430/138; 430/964; 430/203; 430/559; 430/617; 430/619; 430/620; 430/351
[58] Field of Search ............... 430/138, 203, 617, 619, 430/620, 559, 338, 351, 964

[56] References Cited

U.S. PATENT DOCUMENTS

| | | | |
|---|---|---|---|
| 3,667,958 | 6/1972 | Evans | 430/617 |
| 4,560,637 | 12/1985 | Maeda et al. | 430/264 |
| 4,562,143 | 12/1985 | Hirabayashi et al. | 430/620 |
| 4,624,910 | 11/1986 | Takeda | 430/203 |
| 4,649,098 | 3/1987 | Takeda | 430/264 |

Primary Examiner—Won H. Louie
Attorney, Agent, or Firm—Sughrue, Mion, Zinn, Macpeak, and Seas

[57] ABSTRACT

A light-sensitive material is described, comprising a support having provided thereon a light-sensitive layer containing at least a light-sensitive silver halide, a polymerizable compound, a color image forming substance, and a hydrazine derivative represented by formula (I):

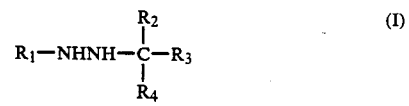

wherein $R_1$ represents a monovalent group derived from a substituted or unsubstituted aromatic ring or aromatic heterocyclic ring; $R_2$ and $R_3$ each represents a substituted or unsubstituted aryl group; and $R_4$ represents a hydrogen atom or a substituted or unsubstituted alkyl, aryl, alkoxycarbonyl, or carbamoyl group, in which the color image forming substance is immobilized by imagewise exposure to light followed by heat development under conditions substantially not containing water. The material exhibits high sensitivity and provides a color image through a simple, easy, and rapid dry processing step, with a reduced exposure time.

17 Claims, No Drawings

LIGHT-SENSITIVE MATERIAL

FIELD OF THE INVENTION

This invention relates to a light-sensitive material. More particularly, it relates to a light-sensitive material in which a light-sensitive silver halide is used as a photosensor to form a latent image thereon when imagewise irradiated with actinic radiation, and a polymerizable compound is then imagewise polymerized or crosslinked to thereby immobilize a coexisting dye or a dye-forming substance.

BACKGROUND OF THE INVENTION

Various light-sensitive materials utilizing silver halides as a photo-sensor, excluding so-called conventional photographic light-sensitive materials, are known.

For example, British Patent No. 866,631 discloses a method in which photopolymerization is directly induced by using a silver halide as a catalyst. According to this method, a product resulting from photolysis of a silver halide is considered to act as a catalyst for polymerization, but high sensitivity such as is attained by reduction of silver halides through general development processing cannot be obtained.

Belgian Pat. No. 642,477 describes a method which comprises developing exposed silver halide grains with a general developer and inducing polymerization using the resulting silver image or the unreacted silver halide as a catalyst to imagewise form a polymeric compound. However, this method involves complicated operations.

Further, U.S. Pat. Nos. 3,697,275, 3,687,667, and 3,746,542, and Japanese patent application (OPI) Nos. 138632/82 and 169143/83 (the term "OPI" as used herein refers to a "published unexamined Japanese patent application") describe a method in which an exposed silver halide is developed with a reducing agent and a coexisting vinyl compound initiates polymerization simultaneously with oxidation of the reducing agent to imagewise form a high-molecular weight compound. This method, however, requires a development step using a liquid, and the processing takes a relatively long time.

Thus, each of these known image formation methods using silver halides as a photo-sensor has respective disadvantages, such that high sensitivity cannot be obtained, complicated development processing procedures are required, etc.

SUMMARY OF THE INVENTION

One object of this invention is to provide a light-sensitive material having high sensitivity which can provide a color image through a simple and rapid dry processing step, and with a reduced exposure time.

The above object can be accomplished by a light-sensitive material comprising a support having provided thereon a light-sensitive layer containing at least a light-sensitive silver halide, a polymerizable compound, a color image-forming substance and a hydrazine derivative represented by the following formula (I)

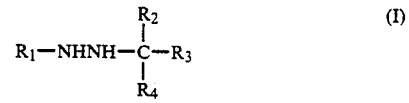

wherein $R_1$ represents a monovalent group derived from a substituted or unsubstituted aromatic ring or aromatic heterocyclic ring; $R_2$ and $R_3$ each represents a substituted or unsubstituted aryl group; and $R_4$ represents a hydrogen atom or a substituted or unsubstituted alkyl, aryl, alkoxycarbonyl or carbamoyl group, in which the color image forming substance is immobilized by imagewise exposure to light followed by heat development under conditions substantially not containing water.

DETAILED DESCRIPTION OF THE INVENTION

In the above-described formula (I), the aromatic ring or aromatic heterocyclic ring constituting $R_1$ includes benzene, naphthalene, anthracene, pyridine, imidazole, benzimidazole, benzotriazole, thiazole, benzothiazole, phthalazine, quinoline, isoquinoline, etc.

Substituents for these rings include an alkyl group (e.g., a methyl group, an ethyl group, a butyl group, a t-butyl group, a t-amyl group, a 2-ethylhexyl group, a t-octyl group, a nonyl group, a dodecyl group, an octadecyl group, etc.), an aryl group (e.g., a phenyl group, a tolyl group, a benzyl group, a diphenylmethyl group, etc.), a halogen atom (e.g., a fluorine atom, a chlorine atom, a bromine atom, etc.), an alkyloxy or aryloxy group (e.g., a methoxy group, an ethoxy group, a 2-methoxyethoxy group, a benzyloxy group, an octyloxy group, an octadecyloxy group, a phenyloxy group, etc.), an alkyl- or aryl-sulfonyl group (e.g., a methylsulfonyl group, an ethylsulfonyl group, a butylsulfonyl group, a benzylsulfonyl group, an octylsulfonyl group, a dodecylsulfonyl group, an octadecylsulfonyl group, a benzenesulfonyl group, etc.), a cyano group, a carbamoyl group, a substituted carbamoyl group (e.g., an N,N-diethylcarbamoyl group, an N,N-dibutylcarbamoyl group, an N,N-dioctylcarbamoyl group, an N-methyl-N-octadecylcarbamoyl group, an N-methyl-N-benzylcarbamoyl group, etc.), a sulfamoyl group, a substituted sulfamoyl group (e.g., an N,N-diethylsulfamoyl group, a 2-ethylhexylsulfamoyl group, an N,N-dibutylsulfamoyl group, an N,N-dioctylsulfamoyl group, an N-methyl-N-octadecylsulfamoyl group, an N-methyl-N-octadecylsulfamoyl group, etc.), an alkylcarbonyl or arylcarbonyl group (e.g., an acetyl group, a benzoyl group, etc.), and the like.

Preferred examples of $R_1$ includes a monovalent group derived from a substituted or unsubstituted benzene, naphthalene, thiazole, or phthalazine.

Reactivity of the compounds (I) can be controlled by selecting substituents for these preferred groups from electron-attractive groups or electron-donating groups.

Specific examples of $R_2$ and $R_3$ preferably include a phenyl group, a p-chlorophenyl group, a tolyl group, a p-bromophenyl group, a p-methoxyphenyl group, a 2,6-dichlorophenyl group, a p-cyanophenyl group, etc.

Specific examples of $R_4$ include a hydrogen atom, an alkyl group, e.g., a methyl group, an ethyl group, a butyl group, an amyl group, a 2-ethylhexyl group, a dodecyl group, an octadecyl group, etc.; an aryl group, e.g., a phenyl group, a p-chlorophenyl group, a tolyl group, a p-bromophenyl group, a p-methoxyphenyl group, a 2,6-dichlorophenyl group, a p-cyanophenyl group, etc.; an alkoxycarbonyl group, e.g., a methoxycarbonyl group, an ethoxycarbonyl group; a carbamoyl group; a substituted carbamoyl group, e.g., an N,N-diethylcarbamoyl group, an N,N-dibutylcarbamoyl group, etc. Of these, a methyl group, a phenyl group, a p-chlorophenyl group, a p-bromophenyl group, and a methoxycarbonyl group are preferred.

Specific examples of preferred hydrazine derivatives which can be used in this invention are shown below.

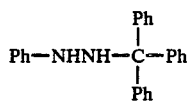
D-1

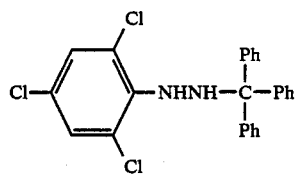
D-2

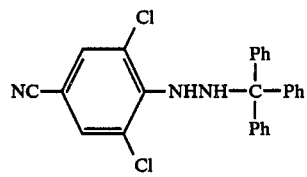
D-3

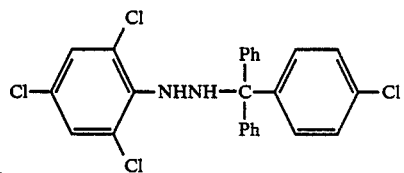
D-4

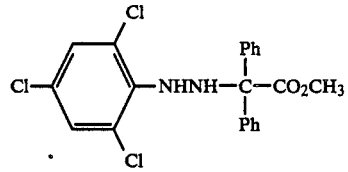
D-5

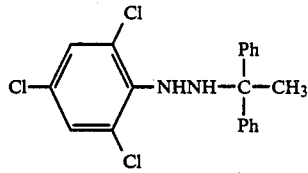
D-6

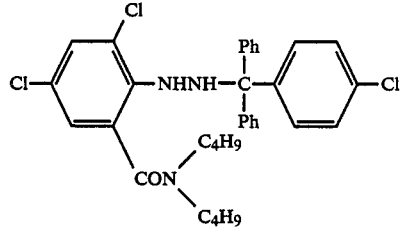
D-7

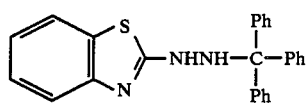
D-8

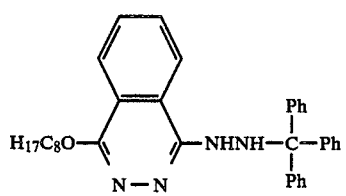
D-9

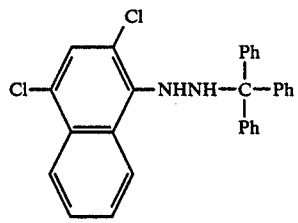
D-10

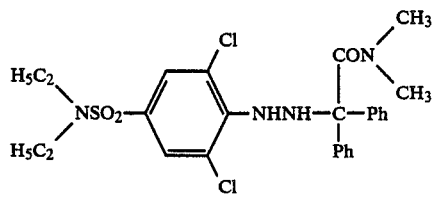
D-11

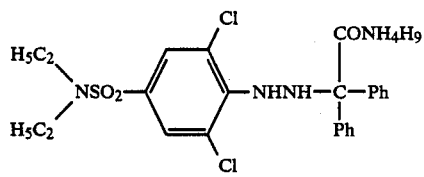
D-12

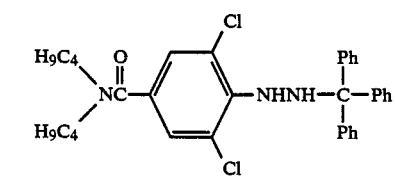
D-13

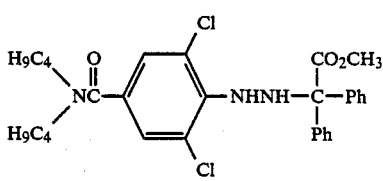
D-14

-continued
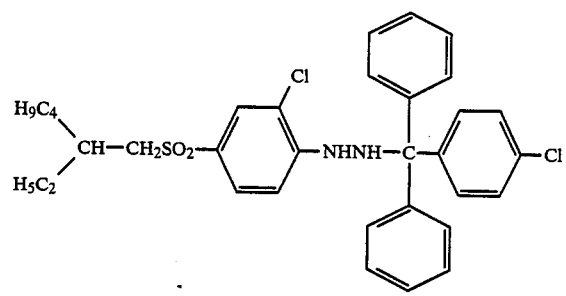
D-15
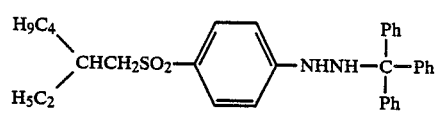
D-16
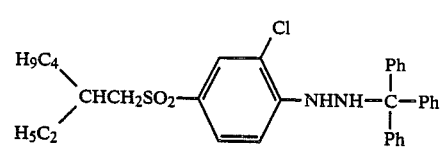
D-17
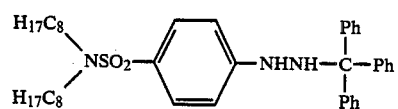
D-18
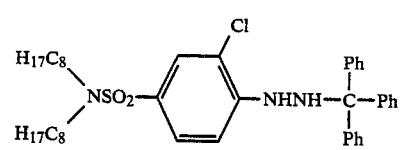
D-19
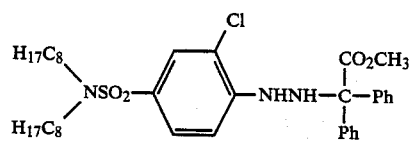
D-20
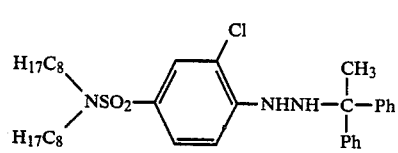
D-21
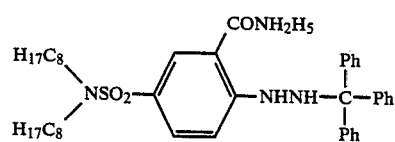
D-22
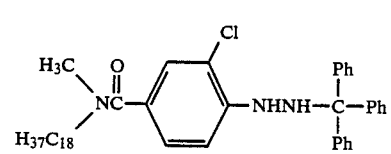
D-23
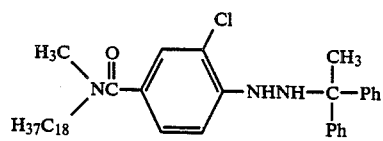
D-24
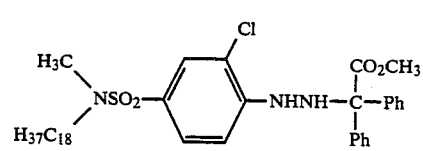
D-25
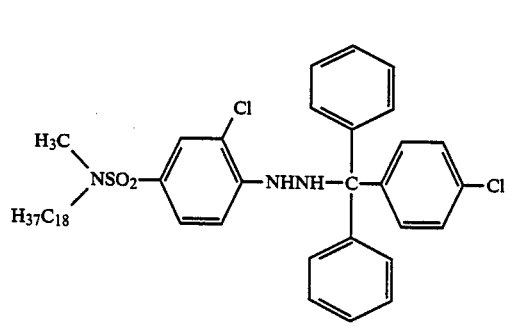
D-26
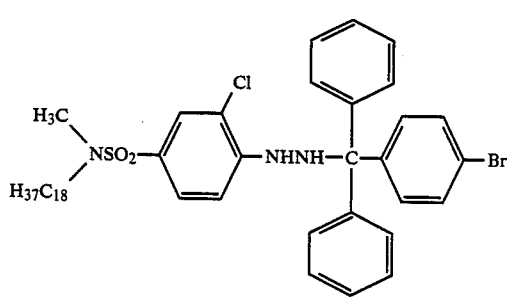
D-27

-continued
D-28
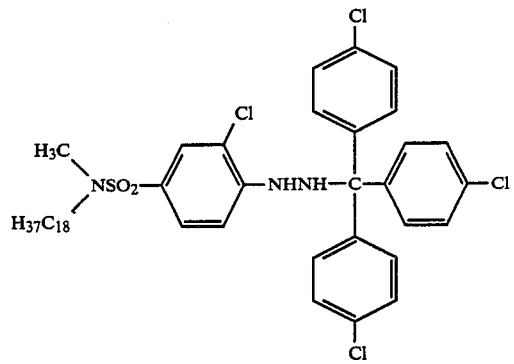
D-29
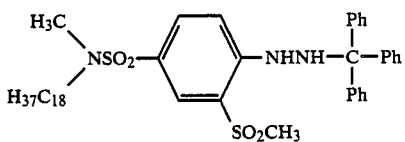
D-30
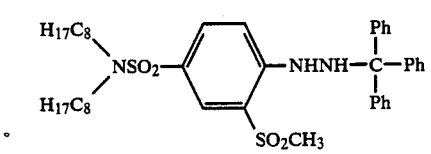
D-31
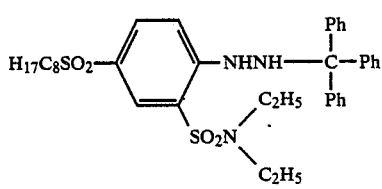
D-32
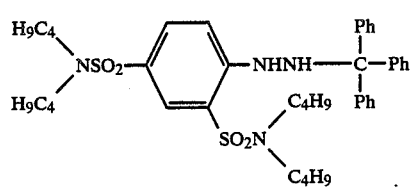
D-33
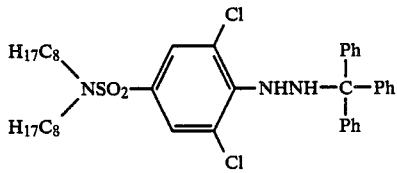
D-34
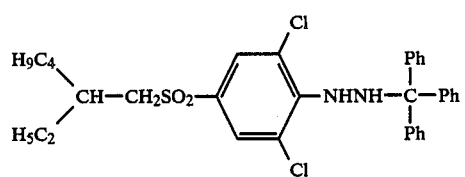
D-35
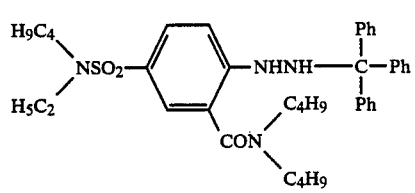
D-36
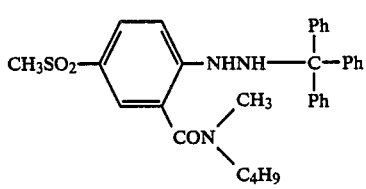
D-37
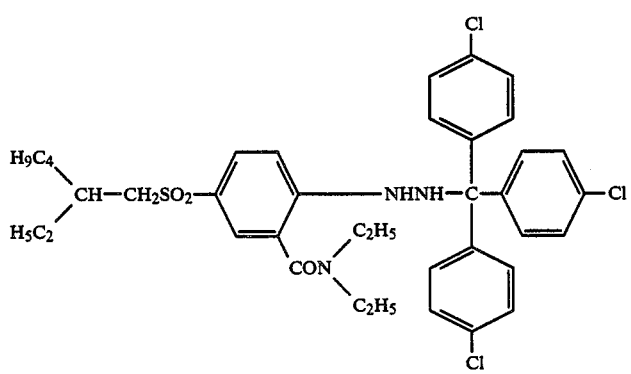

-continued

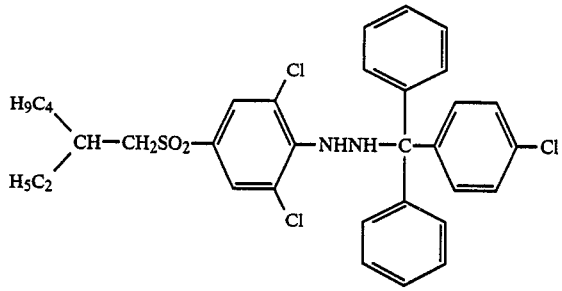
D-38

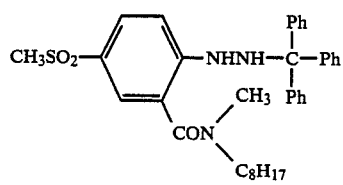
D-39

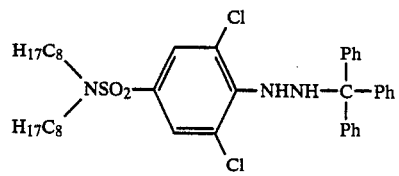
D-40

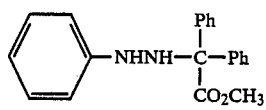
D-41

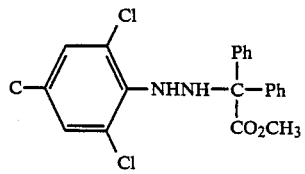
D-42

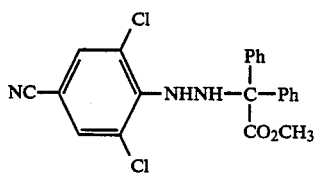
D-43

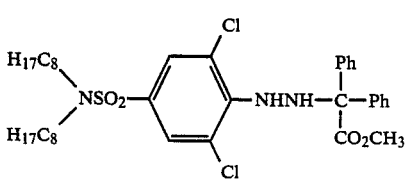
D-44

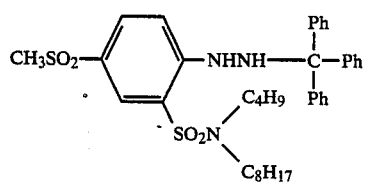
D-45 wherein Ph represents

 group.

Synthesis of the hydrazine derivatives according to the present invention will be illustrated by way of synthesis examples.

SYNTHESIS EXAMPLE 1

Synthesis of Compound D-1

To a mixture of 43.2 g (0.4 mol) of phenylhydrazine and 500 ml of tetrahydrofuran was added 55.7 g (0.2 mol) of trityl chloride in small portions at room temperature while stirring. After the addition, the mixture was heated to 30° C. to cause gradual heat generation, reaching 50° C. The mixture was heated to 50° C. for 5 hours with stirring, followed by cooling to room temperature. The crystals formed were collected by filtration and washed with tetrahydrofuran. The washing and the filtrate were combined, and the solvent was removed therefrom by distillation under reduced pressure. The residue was recrystallized twice from benzene-hexane (1/1 by volume) to obtain 38 g (yield: 54%) of substantially colorless prism crystals having a melting point of 131° to 133° C. (with decomposition).

SYNTHESIS EXAMPLE 2

Synthesis of Compound D-2

To a mixture of 99.2 g (0.40 mol) of 2,4,6-trichlorophenylhydrazine hydrochloride and 750 ml of tetrahydrofuran was dropwise added 55.4 ml of triethylamine at room temperature. To the mixture was added 55.7 g (0.2 mol) of trityl chloride in small portions, and the resulting mixture was heated at 50° to 60° C. for 3 hours, followed by cooling to room temperature. The thus formed crystals were collected by filtration and washed with tetrahydrofuran. The washing and the filtrate were combined and distilled under reduced pressure to remove the solvent. The residue was recrystallized from acetonitrile to obtain 62.9 g (yield: 69%) of white crystals having a melting point of 144° to 147° C. (with decomposition).

SYNTHESIS EXAMPLE 3

Synthesis of Compound D-39

1. Synthesis of 2-Chloro-5-Methanesulfonylbenzenesulfonyl Chloride (D-39a):

To 300 ml of chlorosulfonic acid (4.53 mol) was added 300 g (1.57 mol) of 4-methanesulfonylchlorobenzene at room temperature while stirring. The mixture was heated to 120° C., at which the stirring was continued for 16 hours. After allowing the mixture to cool, the mixture was poured into ice-water, and the resulting crystals were collected by filtration and air-dried to obtain 293 g of D-39a (yield: 64%).

2. Synthesis of 2-(N-Butyl-N-Octylsulfamoyl)-4-Methanesulfonylchlorobenzene (D-39b):

52.5 g (0.28 mol) of butyloctylamine, 35 g (0.38 mol) of triethylamine and 200 ml of N,N-dimethylformamide were mixed, and 81.2 g of crystal of D-39a was added to the mixture under ice-cooling while stirring. The stirring was further continued for 3 hours at 50° C. After allowing the reaction mixture to cool, the reaction mixture was poured into water and extracted with ethyl acetate. The organic layer was washed several times with dilute hydrochloric acid and water and dried over magnesium sulfate. The magnesium sulfate was removed by filtration, and the solvent was removed by distillation. The residue was purified by silica gel column chromatography to obtain 83 g (yield: 67%) of D-39b as an oily product.

3. Synthesis of 2-(N-Butyl-N-Octylsulfamoyl)-4-Methanesulfonylphenylhydrazine (D-39c):

In ethanol, 62.1 g (0.14 mol) of D-39b was dissolved, and the solution was added dropwise to a mixture of 35 g (0.7 mol) of hydrazine hydrate and ethanol. After completion of the dropwise addition, the mixture was heated to 50° C. and stirred for 10 hours at that temperature, followed by cooling. The reaction mixture was poured into water and extracted with ethyl acetate. The organic layer was washed several times with dilute hydrochloric acid and water, dried over magnesium sulfate and distilled to remove the solvent. The residue was purified by silica gel column chromatography to obtain 59 g (yield: 97%) of D-39c).

4. Synthesis of D-39

In tetrahydrofuran were dissolved 59 g (0.136 mol) of D-39c and 15 g (0.15 mol) of triethylamine, and 40 g (0.143 mol) of triphenylmethyl chloride was added to the solution as being solid, followed by stirring at 50° C. for 6 hours. After allowing to cool, the thus precipitated crystals were filtered. The solvent was removed from the filtrate by distillation. Methanol was added to the residue, followed by cooling to 5° C. or less to crystallize. The resulting crystals were recrystallized from methanol to obtain 40 g (yield: 43%) of D-39 having a melting point of 108° to 110° C.

These hydrazine derivatives are usually dissolved in a solvent, such a cyclohexanone, and used as oil droplets or microcapsules as hereinafter described.

The amount of the hydrazine derivative to be added ranges from 0.1 to 1500 mol%, and preferably is from 10 to 300 mol%, per mol of silver, and is from 0.01 to 50 mol%, and preferably from 0.1 to 20 mol%, per mol of polymrizable compound.

In the light-sensitive material according to the present invention, a light-sensitive silver halide serving as a photo-sensor forms a latent image upon exposure to light, and the thus formed latent image nucleus acts as a catalyst to cause oxidation-reduction reaction between the silver halide and a hydrazine derivative according to the present invention. A polymerization reaction is then initiated in the presence of a radical intermediate that is formed by the oxidation-reaction or a radical that is formed by the oxidation-reduction reaction followed by a reaction between the resulting reaction product and another compound, to thereby immobilize a color image forming substance through polymerization or crosslinking of the polymerizable compound.

Hence, the light-sensitive material according to the present invention preferably comprises a light-sensitive element and an image-receiving element. The term "light-sensitive element" as used herein means an element containing a light-sensitive silver halide, the hydrazine derivative of the present invention, a polymerizable compound, and a color image forming substance, in which at least the polymerizable compound and the color image forming substance are incorporated into the same microcapsules or the same emulsion-dispersed oil droplets. The term "image-receiving element" as used herein means an element in which the color image forming substance released from the above-described light-sensitive element is fixed to form a color image. Embodiments of these elements and image formation methods are set forth below, but the present invention is not limited thereto.

1. An embodiment wherein the color image forming substance is a dye or a pigment, in which:
    (a) a light-sensitive element and an image-receiving element are separately provided on different supports to form a light-sensitive material and an image-receiving material, respectively. The light-sensitive element is imagewise exposed to light followed by heating or uniform exposure to light, and pressure is then applied to the material in contact with the image-receiving material to form a color image on the image-receiving material.
    (b) A support is coated with a light-sensitive material, a light-reflecting layer, and an image-receiving layer, in the order listed. After the light-sensitive material is imagewise exposed to light, followed by heating or uniform exposure to light, pressure is applied thereto to imagewise transfer the color image forming substance to the image-receiving element to thereby form a color image on the image-receiving element.

2. An embodiment wherein a color forming substance is per se colorless or lightly colored, but develops a color upon application of energy. In this case, the same embodiment as in 1-(1) and (b) above are included, but an additional step of energy application to cause the color image forming substance to develop a color is required in either case. However, when the color formation takes place concurrently with the heating or exposure or the pressure application, no special step is necessary.

3. An embodiment wherein the color image forming substance (in this case, called a color former) is per se colorless or lightly colored but develops a color when contacted with another component (called a developer).
    (a) The same embodiment as in 1-(a) above, wherein the image-receiving element further contains a developer. In this case, the color image forming substance and the developer are brought into contact with each other by pressure application to form a color image.

(b) The same embodiment as in 1-(b) above, wherein the image-receiving element further contains a developer. In this case, the color image forming substance and the developer are brought into contact with each other by pressure application to form a color image.

(c) A support is coated with a light-sensitive element and an image-receiving element being adjacent to each other or with a mixture of components of the two elements. In either case, with a developer being employed as a component constituting the image-receiving element, when the light-sensitive material (also serving as an image-receiving material) is imagewise exposed, followed by heating or uniformly exposing to light, and pressure is then applied thereto, the color image forming substance and the developer are brought into contact with the vicinity of the ruptured microcapsules to thereby form a color image. In this embodiment, a visual image can be directly obtained, since the color image forming substance in the non-developed area is substantially colorless.

Various types of recording materials utilizing microcapsules are hitherto known. For example, U.S. Pat. No. 3,219,446 (corresponding to Japanese Patent Publication No. 14344/67) discloses a method, in which a light-sensitive sheet having numerous droplets of a fluid is imagewise exposed to light to thereby immobilize the fluid, and the exposed sheet is superposed on the image-receiving sheet, followed by applying pressure over the entire surface of the sheet to transfer an image corresponding to the imagewise exposure onto the image-receiving sheet.

Japanese patent application (OPI) No. 89915/77 (the term "OPI" used herein means "unexamined published application") discloses a method for obtaining an image in which one component of a two-component type heat-sensitive color forming system and a photopolymerizable monomer are encapsulized, and a mixture of another component of the heat-sensitive color forming system and the microcapsules is coated on a base to form a light-sensitive sheet, which is imagewise exposed to light to cure the microcapsules in the exposed areas followed by uniformly heating to develop a color on only the unexposed areas.

Japanese patent application (OPI) Nos. 124343/82, 17836/82, and 197538/82 disclose an image formation method using microcapsules containing a vinyl compound, a photopolymerization initiator, and a dye precursor, by which a dye image can be obtained by applying pressure all over the material after exposure without requiring heating.

U.S. Pat. No. 3,700,439 (corresponding to Japanese Patent Publication No. 20852/79) discloses an image formation method in which Michler's ketone is encapsulated as a light-sensitive material.

Further, U.S. Pat. No. 3,072,481 discloses a light- and pressure-sensitive image formation method, in which a photosensitive substance that easily forms color upon exposure to light when in a dissolved state but is light-insensitive in a solid state is encapsulated, which method comprises imagewise exposing a layer containing the microcapsules and then rupturing the microcapsules to evaporate the solvent.

However, all of the foregoing image formation methods using mirocapsules have low sensitivity to light, especially to green light or red light. Furthermore, attempts to increase the sensitivity in these methods are attended by reductions in preservability.

The above-described disadvantages can be overcome by the present invention in which a light-sensitive silver halide is used as a photo-sensor.

According to the present invention, it is possible to form a polymeric compound in either the exposed areas or the unexposed areas, depending on the type of the light-sensitive silver halide. The areas wherein a polymeric compound has been formed has increased pressure resistance as compared with the area wherein a polymeric compound has not been formed so that a color image comprising a color image forming substance can be formed by, for example, transferring the latter area to an image-receiving material by pressure application. Therefore, it is possible, in the present invention, to provide an image either negative or positive to an original, according to the type of the light-sensitive silver halide used or the color image formation process adopted. In some cases, it is also possible to form both a negative image and a positive image at the same time.

For instance, in the case of obtaining a color image by transfer of the area wherein no polymeric compound is formed, an image positive to an original can be obtained by the use of a conventional negative silver halide emulsion. To the contrary, a negative image can be obtained by using an inner image type silver halide emulsion as described in U.S. Pat. Nos. 3,206,313, 3,367,778 and 3,447,927 or a mixture of a surface image type silver halide emulsion and an inner image type silver halide emulsion as described in U.S. Pat. No. 2,996,382.

In order to obtain colors having a wide range of a chromaticity diagram using three primary colors according to a subtractive color process, i.e., yellow, magenta, and cyan, a light-sensitive material should contain at least three silver halide emulsions having respective light-sensitivity to different spectral regions. A typical combination of three light-sensitive silver halide emulsions having sensitivity to different spectral regions includes a combination of a blue-sensitive emulsion, a green-sensitive emulsion, and a red-sensitive emulsion, a combination of a green-sensitive emulsion, a red-sensitive emulsion, and an infrared-sensitive emulsion, a combination of a blue-sensitive emulsion, a green-sensitive emulsion, and an infrared-sensitive emulsion, a combination of a blue-sensitive emulsion, a red-sensitive emulsion, and an infrared-sensitive emulsion, and the like. An infrared-sensitive emulsion as herein referred to means an emulsion having light-sensitivity to light of 700 nm or more, and particularly 740 nm or more.

For example, if a combination of a blue-sensitive emulsion, a green-sensitive emulsion and a red-sensitive emulsion is used, an intended object for full color imaging can be achieved by incorporating a yellow image forming substance into blue-sensitive microcapsules inclusive of oil droplets (hereinafter simply referred to microcapsules), a magenta image forming substance into green-sensitive microcapsules and a cyan image forming substance into red-sensitive microcapsules, respectively.

Use of microcapsules as described above makes it possible to separately incorporate each of yellow, magenta, and cyan image forming substances into the same light-sensitive element, by which a color image can be formed through simple and easy operation.

Silver halides which can be used in the present invention may be any of silver chloride, silver bromide, silver iodide, silver chlorobromide, silver chloroiodide, silver iodobromide and silver chloroiodobromide. The halogen composition of individual grains may be homogeneous or may be heterogeneous to form an outer shell and a core in a multilayered structure as described in Japanese patent application (OPI) Nos. 154232/82, 108533/83, 48755/84 and 52237/84, U.S. Pat. No. 4,433,048 and European Pat. No. 100,984. Plate-like (tabular) grains having a thickness not more than 0.5 $\mu$m, a diameter of at least 0.6 $\mu$m, and a mean aspect ratio of not less than 5 as described in U.S. Pat. Nos. 4,414,310 and 4,435,499 and West German patent publication (OLS) No. 3241646A$_1$, etc., or a monodisperse emulsion having nearly uniform grain size distribution as described in Japanese patent application (OPI) Nos. 178235/82, 100846/83 and 14829/83, International Publication No. 83/02338A$_1$, European Pat. Nos. 64,412A$_3$ and 83,377A$_1$, etc., can also be used in the present invention. Two or more kinds of silver halide different in crystal habit, halogen composition, grain size, grain size distribution, and the like may be used in combination. A mixture of two or more kinds of monodispersed emulsions being different in grain size may be used in order to control gradation.

The silver halide grains to be used in the invention preferably have a mean diameter of from 0.001 to 10 $\mu$m, and more preferably from 0.001 to 5 $\mu$m, The silver halide emulsion can be prepared by any of the acid process, the neutral process and the ammonia process. The soluble silver salt and the halogen salt can be reacted in accordance with a single jet process, a double jet process or a combination thereof. A reverse mixing method, in which grains are formed in the presence of excess silver ions, or a controlled double jet process, in which a pAg value is maintained constant, can also be employed. In order to accelerate grain growth, the concentrations or amounts of the silver salt and halogen salt to be added or the rate of their addition may be increased as described in Japanese patent application (OPI) Nos. 142329/80 and 158124/80, U.S. Pat. No. 3,650,757, etc.

Epitaxially grown silver halide grains as described in Japanese patent application (OPI) No. 16124/81 and U.S. Pat. No. 4,094,684 may also be used.

In the formation of silver halide grains to be used in the invention, ammonia, an organic thioether derivative as described in Japanese patent publication No. 11386/72 or a sulfur-containing compound as described in Japanese patent applicationn (OPI) No. 144319/78 can be used as a silver halide solvent. In the grain formation or physical ripening, a cadmium salt, a zinc salt, a lead salt, a thallium salt, etc., may be present in the system.

For the purpose of overcoming high or low intensity reciprocity law failure, a water-soluble iridium salt, e.g., iridium (III, IV) chloride, ammonium hexachloroiridate, etc., or a water-soluble rhodium salt, e.g., rhodium chloride, etc., can be used.

The silver halides are used in the form of an emulsion. After the grain formation or physical ripening, soluble salts may be removed from the resulting emulsion by a known noodle washing method or a sedimentation method. The silver halide emulsion may be used in a primitive state, but is usually subjected to chemical sensitization. Chemical sensitization can be carried out by sulfur sensitization, reduction sensitization or noble metal sensitization, or a combination thereof that are known for emulsions for conventional light-sensitive materials. The chemical sensitization can be effected in the presence of a nitrogen-containing heterocyclic compound as disclosed in Japanese patent application (OPI) Nos. 126526/83 and 215644/83.

The silver halide emulsion of the present invention may be of a surface latent image type that forms a latent image predominantly on the surface of silver halide grains or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese patent publication No. 3534/83 and Japanese patent application (OPI) No. 136641/82, etc. The nucleating agent that is preferably combined with the inner latent image type emulsion is described in U.S. Pat. Nos. 3,227,552, 4,245,037, 4,255,511, 4,266,013 and 4,276,364 and West German patent publication (OLS) No. 2,635,316.

The light-sensitive silver halide is coated to a silver coverage of from 1 mg to 10 g per m$^2$.

In the present invention, an organic silver halide that is relatively stable to light can be used as an oxidizing agent in combination with the light-sensitive silver halide. Such being the case, it is necessary that the light-sensitive silver halide and the organic silver salt be in contact with each other or lie close together. It is believed that the organic silver salt oxidizing agent takes part in a redox reaction using a silver halide latent image as a catalyst when heated to a temperature of 80° C. or higher, and preferably 100° C. or higher.

Organic compounds which can be used for forming such an organic silver salt oxidizing agent include aliphatic or aromatic carboxylic acids, thiocarbonyl group-containing compounds having a mercapto compound or an $\alpha$-hydrogen atom, imino group-containing compounds, and the like.

Typical examples of silver salts of the aliphatic carboxylic acids include those derived from behenic acid, stearic acid, oleic acid, lauric acid, capric acid, myristic acid, palmitic acid, maleic acid, fumaric acid, tartaric acid, furonic acid, linolic acid, linoleic acid, adipic acid, sebacic acid, succinic acid, acetic acid, butyric acid or camphoric acid. Silver salts derived from the above-enumerated fatty acids substituted with a halogen atom or a hydroxyl group or aliphatic carboxylic acids having a thioether group may also be used.

Typical examples of silver salts of the aromatic carboxylic acids or other carboxyl group-containing compounds include those derived from benzoic acid, 3,5-dihydroxybenzoic acid, o-, m- or p-methylbenzoic acid, 2,4-dichlorobenzoic acid, acetamidobenzoic acid, p-phenylbenzoic acid, gallic acid, tannic acid, phthalic acid, terephthalic acid, salicyclic acid, phenylacetic acid, pyromellitic acid, 3-carboxymethyl-4-methyl-4-thiazoline-2-thione, etc.

Examples of silver salts of the mercapto group- or thiocarbonyl group-containing compounds having an $\alpha$-hydrogen are those derived from 3-mercapto-4-phenyl-1,2,4-triazole, 2-mercaptobenzimidazole, 2-mercapto-5-aminothiadiazole, 2-mercaptobenzothiazole, S-alkylthioglycolic acids having from 12 to 22 carbon atoms in the alkyl moiety thereof, dithiocarboxylic acids, e.g., dithioacetic acid, etc., thioamides, e.g., thiostearamide, etc., or mercapto compounds described in U.S. Pat. No. 4,123,274, e.g., 5-carboxy-1-methyl-2-phenyl-4-thiopyridine, mercaptotriazine, 2-mercaptobenzoxazole, mercaptooxadiazole, 3-amino-5-benzylthio-1,2,4-triazole, etc.

Typical examples of silver salts of the imino group-containing compounds include those derived from benzotriazole or derivatives thereof as described in Japanese patent publication Nos. 30270/69 and 18416/70, such as benzotriazole, alkyl-substituted benzotriazoles, e.g., methylbenzotriazole, etc., halogen-substituted benzotriazoles, e.g., 5-chlorobenzoptriazole, etc., and carboimidobenzotriazoles, e.g., butylcarboimidobenzotriazole, etc.; nitrobenzotriazoles as described in Japanese patent application (OPI) No. 118639/83; sulfobenzotriazole, carboxybenzotriazole or salts thereof or hydroxybenzotriazole as described in Japanese patent application (OPI) No. 118638/83; 1,2,4-triazole, 1H-tetrazole, carbazole, saccharin or imidazole or derivatives thereof as described in U.S. Pat. No. 4,220,709; and the like.

In addition, silver salts or organic metal salts other than silver salts, e.g., copper stearate, as described in *Research Disclosure*, RD No. 17029 (June 1978) and silver salts of alkynyl group-containing carboxylic acids, e.g., phenylpropiolic acid, as described in Japanese patent application No. 221535/83 can also be used in the present invention.

The above-described organic silver salt can be used in an amount of from 0.01 to 10 mols, and preferably from 0.01 to 1 mol, per mol of a light-sensitive silver halide. A total coverage of the light-sensitive silver halide and the organic silver salt generally ranges from 1 mg to 10 g per $m^2$.

The emulsion to be used in the present invention can contain various compounds for the purpose of preventing fog during the preparation, preservation or photographic processing of the light-sensitive material or stabilizing photographic performance properties. Such compounds include any conventional antifoggants or stabilizers, such as azoles, e.g., benzothiazolium salts, nitroimidazoles, nitrobenzimidazoles, chlorobenzimidazoles, bromobenzimidazoles, mercaptothiazoles, mercaptobenzothiazoles, mercaptobenzimidazoles, mercaptothiadiazoles, aminotriazoles, benzotriazoles, nitrobenzotriazoles, mercaptotetrazoles (especially 1-phenyl-5-mercaptotetrazole), etc.; mercaptopyrimidines; mercaptotriazines; thioketo compounds, e.g., oxazolinethione; azaindenes, e.g., triazaindenes, tetraazaindenes (especially 4-hydroxy-substituted (1,3,3a,7)tetraazaindenes), pentaazaindenes, etc.; benzenethiosulfonic acid, benzenesulfinic acid, benzenesulfonic acid amide, and the like. For example, those described in U.S. Pat. Nos. 3,954,474 and 3,982,947, Japanese patent publication No. 28660/77, etc., can be used.

In the preparation of the silver halide emulsions according to the present invention, gelatin is advantageously used as a protective colloid, but other hydrophilic colloids may also be employed. Examples of usable hydrophilic colloids include proteins, e.g., gelatin derivatives, graft polymers of gelatin and other high polymers, albumin, casein, etc.; cellulose derivatives, e.g., hydroxyethyl cellulose, carboxymethyl cellulose, cellulose sulfate, etc.; sugar derivatives, e.g., sodium alginate, starch derivatives, etc.; and a wide variety of synthetic hydrophilic high polymers, such as polyvinyl alcohol, polyvinyl alcohol partial acetal, poly-N-vinylpyrrolidone, polyacrylic acid, polymethacrylic acid, polyacrylamide, polyvinylimidazole, polyvinylpyrazole, etc. and copolymers comprising monomers constituting these homopolymers.

Gelatin to be used includes not only lime-processed gelatin, but acid-processed gelatin and enzyme-processed gelatin as described in *Bull. Sco. Sci. Photo. Japan*, No. 16, 30 (1966). Hydrolysis products or enzymatic decomposition products of gelatin may also be used.

The silver halide which can be used in the present invention may be spectrally sensitized with dyes. Sensitizing dyes to be used include methine dyes, cyanine dyes, merocyanine dyes, complex cyanine dyes, complex merocyanine dyes, holopolar cyanine dyes, hemicyanine dyes, styryl dyes, and hemioxonol dyes. Of these, cyanine dyes, merocyanine dyes and complex merocyanine dyes are particulrly useful.

Any of basic heterocyclic nuclei generally used in cyanine dyes can be applied to these sensitizing dyes. Such nuclei include a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, etc.; these nuclei to which an alicyclic hydrocarbon ring is fused; and these nuclei to which an aromatic hydrocarbon ring is fused, e.g., an indolenine nucleus, a benzindolenine nucleus, an indole nucleus, a benzoxazole nucleus, a naphthoxazole nucleus, a benzothiazole nucleus, a naphthothiazole nucleus, a benzoselenazole nucleus, a benzimidazole nucleus, a quinoline nucleus, etc. These nuclei may have substituents on their carbon atoms.

To the merocyanine dyes or complex merocyanine dyes can be applied 5- or 6-membered heterocyclic nuclei having a ketomethylene structure, such as a pyrazolin-5-one nucleus, a thiohydantoin nucleus, a 2-thiooxazolidine-2,4-dione nucleus, a thiazolidine-2,4-dione nucleus, a rhodanine nucleus, a thiobarbituric acid nucleus, etc.

These sensitizing dyes may be used either individually or in combinations thereof. Combinations of sensitizing dyes are often used for the purpose of supersensitization.

The emulsion may contain, in addition to the sensitizing dyes, a substance which does not per se exhibit spectral sensitization effect or does not substantially absorb visible light but shows supersensitizing activity. Such a substance includes aminostyryl compounds substituted with a nitrogen-containing heterocyclic group as described in U.S. Pat. Nos. 2,933,390 and 3,635,721, aromatic organic acid-formaldehyde condensates as described in U.S. Pat. No. 3,743,510, cadmium salts, azaindene compounds, and the like. In particular, combinations described in U.S. Pat. Nos. 3,615,613, 3,615,641, 3,617,295, and 3,635,721 are useful.

The above-described sensitizing dyes may be incorporated into the silver halide emulsion by directly dispersing or by once dissolving in a solvent, e.g., water, methanol, ethanol, acetone methyl cellosolve, etc., or a mixture thereof, and then adding the solution to the emulsion. They may be first dissolved in a substantially water-immiscible solvent, e.g., phenoxyethanol, etc., and then dispersed in water or a hydrophilic colloid, and the dispersion is added to the emulsion. Further, the sensitizing dyes may be added to the emulsion simultaneously with an oleophilic compound, such as a dye-donative compound, etc., in the form of a mixture. In the case of forming a dye solution, sensitizing dyes to be used in combination may be dissolved individually or a mixture of these dyes may be dissolved all at once.

Moreover, the dye solutions may be added to the emulsion in the form of a mixture thereof, or each of the solutions may be added simultaneously. Addition of the sensitizing dyes to the emulsion can be effected during or before or after the chemical ripening, or before or after the nucleus formation of silver halide grains as described in U.S. Pat. Nos. 4,283,756 and 4,225,666.

The amount of the sensitizing dye to be added generally ranges from about $10^{-8}$ to about $10^{-2}$ mol per mol of silver halide.

The polymerizable compound which can be used in the present invention includes addition polymerizable monomers and oligomers and polymers thereof. The addition polymerizable monomers include compounds having at least one carbon-carbon unsaturated bond. Examples of such compounds are acrylic acid and salts thereof, acrylic esters, acrylamides, methacrylic acid and salts thereof, methacrylic esters, methacrylamides, maleic anhydride, maleic esters, itaconic esters, styrenes, vinyl ethers, vinyl esters, N-vinyl hetero rings, aryl ethers, aryl esters, and derivatives of these compounds.

Any of the above-enumerated compounds are useful in the present invention, but those having a boiling point of 80° C. or higher that are hardly evaporated upon heating for heat development are preferred. Further, in order to increase contrast of the resulting color image, it is desirable to use a crosslinkable compound having an activity to increase viscosity or hardness of the resulting polymeric compound. The crosslinkable compound as herein referred to is a so-called polyfunctional compound having a plurality of vinyl groups or vinylidene groups in its molecule. Specific examples of the polymerizable compounds which can be preferably used in the present invention are shown below.

Acrylic acid, methacrylic acid, butyl acrylate, methoxyethyl acrylate, butyl methacrylate, acrylamide, N,N-dimethylacrylamide, N,N-diethylacrylamide, N-acryloylmorpholine, N-acryloylpiperidine, glycidyl acrylate, 2-ethylhexyl acrylate, acrylic anilide, methacrylic acid anilide, styrene, vinyltoluene, chlorostyrene, methoxystyrene, chloromethylstyrene, 1-vinyl-2-methylimidazole, 1-vinyl-2-undecylimidazole, 1-vinyl-2-undecylimidazoline, N-vinylpyrrolidone, N-vinylcarbazole, vinylbenzyl ether, vinylphenyl ether, methylenebisacrylamide, trimethylenebisacrylamide, hexamethylenebisacrylamide, N,N'-diacryloylpiperazine, m-phenylenebisacrylamide, p-phenylenebisacrylamide, ethylene glycol diacrylate, propylene glycol dimethacrylate, diethylene glycol diacrylate, polyethylene glycol diacrylate, bis(4-acryloxypolyethoxyphenyl)propane, 1,5-pentanediol diacrylate, neopentyl glycol diacrylate, 1,6-hexanediol acrylate, polypropylene glycol diacrylate, pentaerythritol triacrylate, trimethylolpropane triacrylate, pentaerythritol tetraacrylate, N-methylolacrylamide, diacetonacrylamide, triethylene glycol dimethacrylate and pentaerythritol tetraaryl ether.

In addition, polymeric compounds having a vinyl group or a vinylidene group, such as a condensation product between a polymeric compound having a hydroxyl group, an amino group, an epoxy group, a halogen atom or a sulfonyloxy group in its side chain and acrylic acid, methacrylic acid or a derivative thereof can also be utilized.

Furthermore, color image forming substances, e.g., dyes or leuco dyes, having a vinyl group in their molecule may also serve as a polymerizable compound combined with a color image forming substance.

The above-described polymerizable compound according to the present invention can be used in an amount of from 5 to $1.2 \times 10^5$ parts by weight, and preferably from 12 to $1.2 \times 10^4$ parts by weight, per part by weight of silver halide.

The color image forming substances which can be used in the present invention include various kinds. For example, those which are per se colored include dyes and pigments. When these substances are used, a color image can be formed by destroying microcapsules in the area where a polymeric compound is not formed and transferring the colored substance to an image-receiving material by an appropriate means. The dyes and pigments to be used include those commercially available and, in addition, various known compounds described in the technical literature, e.g., Yuki Gosei Kagaku Kyokai (ed.), *Senryo Binran* (1970) and Nippon Ganryo Gijutsu Kyokai (ed.), *Saishin Ganryo Brinran* (1977). These dyes or pigments are used in the form of a solution or dispersion.

On the other hand, non-colored color image forming substances are divided into those which develop a color by some energy, such as heating, pressure application, light irradiation, and the like, and those which do not develop a color by application of energy, but rather develop a color upon contact with another component. Known examples of the former are thermochromic compounds, piezochromic compounds, photochromic compounds, and leuco compounds derived from triarylmethane dyes, quinone dyes, indigoid dyes, azine dyes, etc. These compounds are capable of developing a color by heating, application of pressure, light irradiation or air oxidation. Examples of the latter include various systems capable of developing a color through some reaction between two or more components, such as acid-base reaction, oxidation-reduction reaction, coupling reaction, chelating reaction, and the like. Such color formation systems specifically include a color formation system used in pressure-sensitive papers, etc., comprising a color former having a partial structure of lactones, lactams, spiropyrans, etc., and an acidic substance (developer), e.g., acid clay, phenols, etc.; a system utilizing azo-coupling reaction between aromatic diazonium salts, diazotates or diazosulfonates and naphthols, anilines, active methylenes, etc.; a system utilizing a chelating reaction, such as a reaction between hexamethylenetetramine and a ferric ion and gallic acid, or a reaction between a phenolphthalein-complexon and an alkaline earth metal ion; a system utilizing an oxidation-reduction reaction, such as a reaction between ferric stearate and pyrogallol, or a reaction between silver behenate and 4-methoxy-1-naphthol, etc.

Another known example of the color formation system utilizing a reaction between two components is a system in which such a reaction proceeds upon heating. In this system, heating is required simultaneously or immediately after the pressure application for microcapsule rupture by which the two components are mixed.

The color formers in the above-described color former/developer system include (1) triarylmethanes, (2) diphenylmethanes, (3) xanthenes, (4) thiazines, (5) spiropyrans, and the like. Specific examples of such color formers are described, e.g., in British Pat. No. 2,033,594 (corresponding to Japanese Patent Application (OPI) No. 27253/80). Among them (1) triarylmethanes and (3)

xanthenes are preferred since many of them cause less fog and provide high color densities. Specific examples of these color formers are Crystal Violet Lactone, 3-diethylamino-6-chloro-7-($\beta$-ethoxyethylamino)fluoran, 3-diethylamino-6-methyl-7-anilinofluoran, 3-triethylamino-6-methyl-7-anilinofluoran, 3-cyclohexylmethylamino-6-methyl-7-anilinofluoran, 3-diethylamino-7-o-chloroanilinofluoran, etc. These compounds may be used either alone or in combination thereof.

The developers which can be used include phenol compounds, organic acids, or metal salts thereof, hydroxybenzoic acid esters, acid clay, and the like.

Examples of the phenol compounds are 4,4'-isopropylidenediphenol (bisphenol A), p-t-butylphenol, 2,4-dinitrophenol, 3,4-dichlorophenol, 4,4'-methylenebis(2,6-di-t-butylphenol), p-phenylphenol, 1,1-bis(4-hydroxyphenyl)cyclohexane, 1,1-bis(4-hydroxyphenol)-2-ethylhexane, 2,2-bis(4-hydroxyphenyl)butane, 2,2'-methylenebis(4-t-butylphenol), 2,2'-methylenebis($\alpha$-phenyl-p-cresol)thiodiphenol, 4,4'-thiobis(6-t-butyl-m-cresol)sulfonyldiphenol, and, in addition, a p-t-butylphenol-formalin condensate, a p-phenylphenolformalin condensate, etc.

Examples of the organic acids or metal salts thereof include phthalic acid, phthalic anhydride, maleic acid, benzoic acid, gallic acid, o-toluylic acid, p-toluylic acid, salicyclic acid, 3-t-butylsalicyclic acid, 3,5-di-t-butylsalicyclic acid, 5-$\alpha$-methylbenzylsalicyclic acid, 3,5-($\alpha$-methylbenzyl)salicyclic acid, 3-t-octylsalicyclic acid and salts of these acids with zinc, lead, aluminum, magnesium, nickel, etc. Of these, salicyclic acid derivatives and their zinc salts or aluminum salts are particularly excellent in terms of color developability, fastness of the developed image, preservability of recording sheets, and the like.

Examples of the hydroxybenzoic acid esters include ethyl p-hydroxybenzoate, butyl p-hydroxybenzoate, heptyl p-hydroxybenzoate, benzyl p-hydroxybenzoate, etc.

An oil-absorbing white pigment may be used in combination for the purpose of helping diffusion and fixing of the content of microcapsules.

In order to induce color formation reaction of the developer by melting at a desired temperature, it is preferable that the developer be added as an eutectic mixture with a low-melting point heat-fusible substance or be added in such a state that a low-melting point compound is fused to the surface of developer particles.

Specific but non-limiting examples of the low-melting point compound include higher fatty acid amides, e.g., stearamide, erucamide, palmitamide, ethylenebisstearamide, etc., waxes, such as higher fatty acid esters, phenyl benzoate derivatives, aromatic ether derivatives and urea derivatives.

The color former used in another color former/developer system include phenolphthalein, fluorescein, 2',4',5',7'-tetrabromo-3,4,5,6-tetrachlorofluorescein, Tetrabromophenol Blue, 4,5,6,7-tetrabromophenolphthalein, Eosine, Aurin Cresol Red, 2-naphtholphenolphthalein, etc.

Developers which can be used in combination with the above-described color formers include nitrogen-containing compounds, such as organic or inorganic ammonium salts, organic amines, amides, urea or thiourea and derivatives thereof, thiazoles, pyrroles, pyrimidines, piperazines, guanidines, indoles, imidazoles, imidazolines, triazoles, morpholines, piperidines, amidines, formamidines, pyridines, etc. Specific examples of such developers are ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine trichloroacetate, N,N'-dibenzylpiperazine, 4,4'-dithiomorpholine, morpholinium trichloroacetate, 2-aminobenzothiazole, 2-benzoylhydrazinobenzothiazole, etc.

The color image forming substance according to the present invention is used in an amount of from 0.5 to 50 parts by weight, and preferably from 2 to 20 parts by weights per 100 parts by weight of the polymerizable compound. The developer is used in an amount of from about 0.3 to about 80 parts by weight per part by weight of the color former.

Preservability of the light-sensitive material according to the present invention can be improved by incorporating a thermal polymerization inhibitor into microcapsules. The amount of the thermal polymerization inhibitor to be added preferably ranges from 0.005 to 5% by weight based on the polymerizable compound.

Microcapsules to be used in the present invention can be prepared by processes known in the art, for example, a process utilizing coacervation of hydrophilic wall-forming materials as described in U.S. Pat. Nos. 2,800,457 and 2,800,458; an interfacial polymerization process as described in U.S. Pat. No. 3,287,154, British Pat. No. 990,443 and Japanese Patent Publication Nos. 19574/63, 446/67 and 771/67; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins, hydroxypropyl cellulose or like wall-forming materials as described in U.S. Pat. No. 4,025,455; an in situ process utilizing polymerization of monomers as described in British Pat. No. 867,797 (corresponding to Japanese Patent Publication No. 9168/61) and U.S. Pat. No. 4,001,140 (corresponding to Japanese Patent Application (OPI) No. 9079/76); an electrolytic dispersion and cooling process as described in British Pat. Nos. 952,807 and 965,074; a spray-drying process as described in U.S. Pat. No. 3,111,407 and British Pat. No. 930,422; and the like. It is preferable, though not limitative, that microcapsules are prepared by emulsifying core materials, followed by formation of a polymeric membrane as a microcapsule wall.

In particular, preferred effects can be obtained when encapsulation is carried out by polymerization of reactants supplied from the inside of oil droplets. According to this process, microcapsules having a uniform particle size and excellent working preservability, that are favorable for light-sensitive materials, can be obtained in a short time.

For example, if in using polyurethane as a capsule wall material, as polyisocyanate and a second component capable of reacting with a polyisocyanate to form a capsule wall, e.g., polyols or polyamines, are mixed in an oily liquid to be encapsulated, and the mixture is emulsified and dispersed in water. The temperature of the dispersion is then elevated to cause polymerization on the oil drop-water interface to thereby form microcapsule walls. In this case, a low-melting point auxiliary solvent having high dissolving power may be added to the oily liquid.

The polyisocyanates and polyols or polyamines that can be used in the above-described reaction are disclosed in U.S. Pat. Nos. 3,281,383, 3,773,695 and 3,793,268, British Pat. No. 1,127,338 (corresponding to Japanese Patent Publication No. 40347/73), U.S. Pat. Nos. 3,723,363 and 3,838,108 (corresponding to Japanese Patent Publication No. 24159/74 and Japanese Patent Application (OPI) No. 80191/73, respectively) and British Pat. No. 1,416,224 (corresponding to Japanese Patent Application (OPI) No. 84086/73).

More specifically, examples of the polyisocyanates include diisocyanates, e.g., m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-4,4'-biphenyldiisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, etc.; triisocyanates, e.g., 4,4'-triphenylmethane triisocyanate, toluene-2,4,6-triisocyanate, etc.; tetraisocyanates, e.g., 4,4'-dimethyldiphenylmethane-2,2',5,5'-tetraisocyanate, etc.; and isocyanate prepolymers, e.g., an adduct of hexamethylene diisocyanate and trimethylolpropane, an adduct of 2,4-tolylene diisocyanate and trimethylolpropane, an adduct of xylylene diisocyanate and trimethylolpropane, an adduct of tolylene diisocyanate and hexanetriol, etc.

Examples of the polyols include aliphatic or aromatic polyhydric alcohols, hydroxypolyesters, hydroxypolyalkylene ethers, and the like. The following polyols described in Japanese Patent Application (OPI) No. 49991/85 can also be used: ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol, pentaerythritol, pentaerythritol ethylene oxide adduct, a glycerin ethylene oxide adduct, glycerin 1,4-di(2-hydroxyethoxy)benzene, a condensation product of an aromatic polyhydric alcohol and an alkylene oxide, e.g., resorcinol dihydroxyethyl ether, etc., p-xylylene glycol, m-xylylene glycol, α,α'-dihydroxy-p-diisopropylbenzene, 4,4'-dihydroxydiphenylmethane, 2-(p,p'-dihydroxyphenylmethyl)benzyl alcohol, an adduct of bisphenol A and ethylene oxide, etc. The polyol is preferably used in such an amount that the molar proportion of hydroxyl group to isocyanate group is from 0.02/1 to 2/1.

Examples of the polyamines include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetetramine, diethylaminopropylamine, tetraethylpentamine, amine adducts of epoxy compounds, and the like.

The polyisocyanates can also form polymeric substances by reaction with water.

In the encapsulation, water-soluble high polymers can be employed. The water-soluble high polymers may be any of anionic high polymers, nonionic high polymers, and amphoteric high polymers. The anionic high polymers, either natural or synthetic, include those having, e.g., $-COO^-$, $-SO_3^-$, etc.

Examples of natural anionic high polymers include gum arabic, alginic acid, etc., and examples of semi-synthetic anionic high polymers include carboxymethyl cellulose, phthalated gelatin, sulfated starch, sulfated cellulose, lignin sulfonic acid, etc. Examples of synthetic anionic high polymers are maleic anhydride (inclusive of a hydrolysate thereof) copolymers, acrylic (inclusive of methacrylic) polymers and copolymers, vinylbenzenesulfonic acid polymers and copolymers, carboxyl-modified polyvinyl alcohol, and the like. The nonionic high polymers include polyvinyl alcohol, hydroxyethyl cellulose, methyl cellulose, and the like. The amphoteric high polymers include gelatin, etc.

These water-soluble high polymers can be used as an aqueous solution at a concentration of from 0.01 to 10% by weight.

According to the present invention, the microcapsules contain at least a polymerizable compound and a color image forming substance as described above. It is usually preferable that the microcapsules further include a silver halide, a reducing agent, and the like. Such being the case, a silver halide and a reducing agent are dispersed or dissolved in the polymerizable compound having dissolved therein the color image forming substance to form an oily phase. The oily phase is then mixed with an aqueous phase having dissolved therein a hydrophilic polymeric compound, followed by emulsifying to prepare an emulsion. Simultaneously with or subsequently to the emulsification, capsule walls can be formed on the oil/water interface of the emulsion particles in a known manner. Microcapsules having no capsule wall, i.e., oil droplets, can be prepared in the same manner as described above, except not using a wall-forming reactant. The above-described encapsulation process is not limitative, and other various processes can be applied.

The size of the microcapsules to be used in the invention is not greater than 80 μm. From the standpoint of preservability and handling property, a capsule size of not greater than 20 μm is preferred. Since microcapsules, if too small, are liable to vanish into voids or fibers of a substrate on which they are applied, the microcapsules preferably have a particle size not less than 0.1 μm, although such value is not necessarily critical, as it depends on the properties of the substrate or support.

It is preferable that the microcapsules to be used in the invention do not undergo substantial change under a pressure of about 10 kg/cm² or less, but are ruptured when a pressure higher than that is applied thereon. To this effect, microcapsules with capsule wall are preferable to oil droplets having no capsule wall. The pressure causing rupture of microcapsules is not limited to a particular value and can be varied according to the purposed use. However, the microcapsules are preferably ruptured under a pressure of about 2,000 kg/cm² or less. Such a pressure characteristic of microcapsules can be controlled by variation in particle size of microcapsules, thickness of the capsule wall, and kinds of wall materials to be used.

In order to change heat reactivity of the light-sensitive materials of the present invention, hydroxyl compounds, carbamic acid ester compounds, aromatic methoxy compounds or organic sulfonamide compounds as described in Japanese Patent Application No. 25838/85 can be used either inside or outside the microcapsules. These compounds are considered to change a glass transition point of the microcapsule wall.

In the present invention, a wide variety of image formation accelerators can be used. The image formation accelerators have a function of accelerating the oxidation-reduction reaction between a silver salt oxidizing agent and a reducing agent, a function to accelerate transfer of an image forming substance from a light-sensitive layer to an image-receiving layer, or a like function. From the physiochemical standpoint, they are classified into base or base precursors, oils, hot-melt solvents, surface active agents, compounds having interaction with silver or a silver ion, and the like. These groups, however, generally have combined functions, i.e., two or more of the above-mentioned effects.

Specific examples of these image formation accelerators classified according to function for the sake of convenience are shown below. It should be noted, however, that one compound often has a plurality of functions combined.

Preferred examples of the bases are inorganic bases, such as hydroxides, secondary or tertiary phosphates, borates carbonates, quinolinates and metaborates of alkali metals or alkaline earth metals; hydroxides of quaternary alkylammoniums; and hydroxides of other metals, and organic bases, such as aliphatic amines (e.g., trialkylamines, hydroxylamines, aliphatic polyamines); aromatic amines (e.g., N-alkyl-substituted aromatic amines, N-hydroxylalkylsubstituted aromatic amines and bis(p-(dialkylamino)phenyl)methanes, heterocyclic amines, amidines, cyclic amidines, guanidines, cyclic guanidines, and the like. Of these, those having a pKa of 8 or more are preferred.

The base precursors preferably include those capable of releasing bases upon some reaction by heating, such as salts of organic acids capable of decarboxylation by heating and bases, compounds capable of releasing amines through intramolecular nucleophilic substitution, Lossen rearrangement, or Beckmann rearrangement, and the like; and those capable of releasing bases by electrolysis. Preferred examples of the former base precursors which generate bases upon heating include salts of trichloracetic acid as described in British Pat. No. 998,949, etc.; salts of α-sulfonylacetic acid as described in U.S. Pat. No. 4,060,420; salts of propiolic acids as described in Japanese patent application (OPI) No. 180537/84; 2-carboxycarboxamide derivatives as described in U.S. Pat. No. 4,088,496; salts of heat-decomposable acids and organic bases as well as alkali metals or alkaline earth metals as a base component as described in Japanese patent application (OPI) No. 195237/84; hydroxamcarbamates which generate bases through Lossen rearrangement as described in Japanese patent application (OPI) No. 168440/84; aldoxime carbamates which generate nitriles by heating as described in Japanese patent application (OPI) No. 157637/84; and the like. In addition, base precursors described in British Pat. No. 998,945, U.S. Pat. No. 3,220,846, Japanese patent application (OPI) No. 22625/75, British Pat. No. 2,079,480, etc., are also useful.

The compounds which produce bases by electrolysis include those subject to electrolytic oxidation and those subject to electrolytic reduction. The former compounds typically include various fatty acid salts. Electrolytic oxidation of these compounds produce carbonates of organic bases, such as alkali metals, guanidiens, amidiens, etc., with extremely high efficiency.

The latter compounds which are subject to electrolytic reduction to form bases include nitro compound and nitroso compounds for formation of amines; nitriles for formation of amines; nitro compounds, azo compounds, azoxy compounds, etc., for formation of p-aminophenols, p-phenylenediamines, hydrazines, etc., and the like. The p-aminophenols, p-phenylenediamines, and hydrazines can be used not only as bases but also as color image forming substances per se. Electrolysis of water in the presence of various inorganic salts to form alkali components may also be utilized.

Specific examples of the base or base precursors are lithium hydroxide, sodium hydroxide, potassium hydroxide, barium hydroxide, sodium carbonate, potassium carbonate, sodium quinolinate, potassium quinolinate, sodium secondary phosphate, potassium secondary phosphate, sodium tertiary phosphate, potassium tertiary phosphate, sodium pyrophosphate, potassium pyrophosphate, sodium metaborate, potassium metaborate, borax, ammonium hydroxide, tetramethylammonium, tetrabutylammonium, ammonia, $MeNH_2$ (wherein Me represents $-CH_3$), $Me_2NH$, $EtNH_2$ (wherein Et represents $-C_2H_5$), $Et_2NH$, $C_4H_9NH_2$, $(C_4H_9)_2NH$, $HOC_2H_4NH_2$, $(HOC_2H_4)_2NH$, $(HOC_2H_4)_3N$, $Et_2NCH_2CH_2OH$, $H_2NC_2H_4NH_2$, $MeNHC_2H_4NHMe$, $Me_2NC_2H_4NH_2$, $H_2NC_3H_6NH_2$, $H_2NC_4H_8NH_2$, $H_2NC_5H_{10}NH_2$, $Me_2NC_2H_4NMe_2$, $Me_2NC_3H_6NMe_2$, guanidinetrichloroacetic acid, piperidinetrichloroacetic acid, morpholinetrichloroacetic acid, p-toluidinetrichloroacetic acid, 2-picolinetrichloroacetic acid, guanidine carbonate, triphenylguanidine, guanidine phenylsulfonylacetate, guanidine 4-chlorophenylsulfonylacetate, guanidine 4-methyl-sulfonylphenylsulfonylacetate, guanidine 4-acetylaminophenylpropiolate, etc. In addition, bases used in conventional photographic light-sensitive materials or processing solution as alkali agents or buffering agents may also be employed.

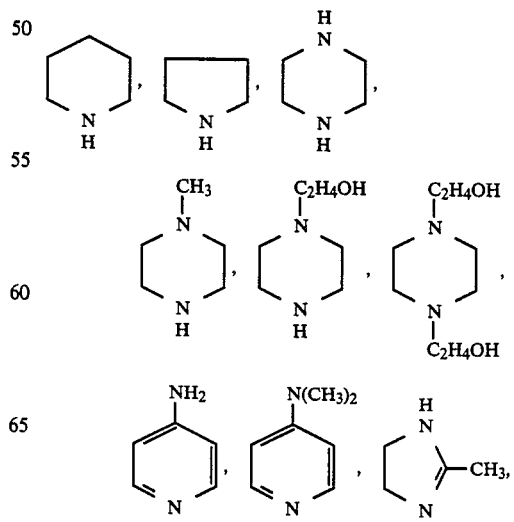

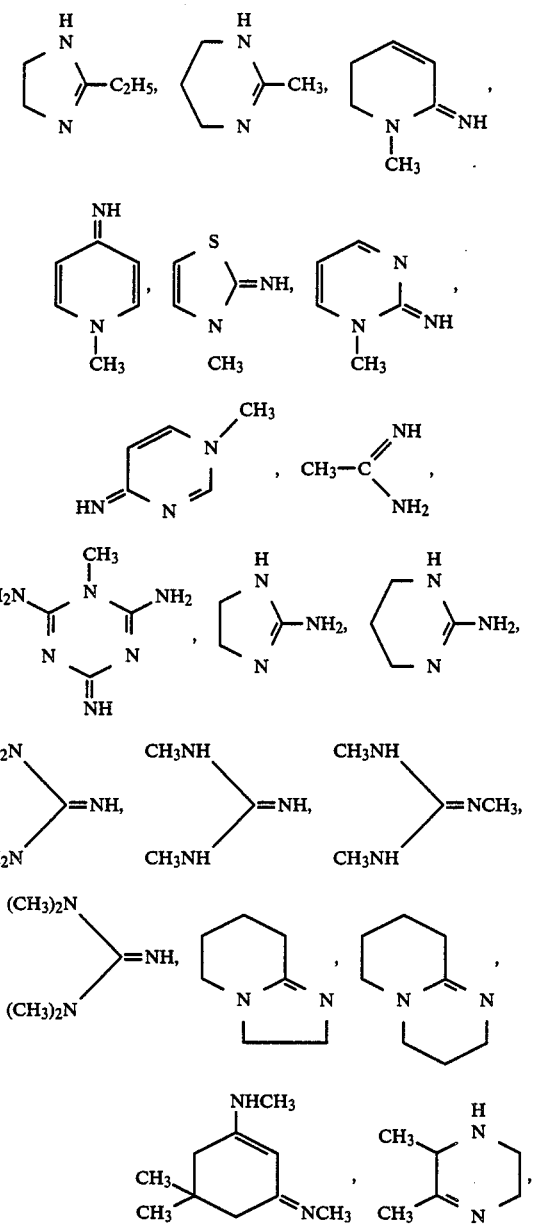

The bases or base precursors according to the present invention can be used in a wide range of an amount, preferably in an amount not more than 50% by weight, and more preferably of from 0.01 to 40% by weight, based on the weight of a coating film of the light-sensitive element. In the present invention, the base or base precursor can be used either individually or in combinations of two or more thereof.

The base or base precursor is dissolved in water or an alcohol and incorporated into a light-sensitive element and/or an image-receiving element in the form of a solution or a dispersion. Further, incorporation of the base or base precursor in the light-sensitive element and/or image-receiving element can also be carried out by the method disclosed in U.S. Pat. No. 2,322,027 using a high-boiling point organic solvent. Further, the base or base precursor may be dissolved in a low boiling point organic solvent having a boiling point of from 30° to 160° C., such as lower alkyl acetates, e.g., ethyl acetate, butyl acetate, etc., ethyl propionate, sec-butyl alcohol, methyl isobutyl ketone, β-ethoxyethyl acetate, methyl cellosolve acetate, cyclohexane, etc., and then incorporated into the light-sensitive element and/or image-receiving element in the form of a dispersion. The high-boiling point organic solvents to be used include alkyl phthalates (e.g., dibutyl phthalate, dioctyl phthalate, etc.), phosphoric esters (e.g., diphenyl phosphate, triphenyl phosphate, tricresyl phosphate, dioctylbutyl phosphate, etc.), citric esters (e.g., acetyl tributyl citrate, etc.), benzoic esters (e.g., octyl benzoate, etc.), alkylamides (e.g., diethyllaurylamide, etc.), fatty acid esters (e.g., dibutoxyethyl succinate, dioctyl azelate, etc.), trimesic esters (e.g., tributyl trimesate, etc.), and the like.

The above-described high boiling point organic solvents and the low-boiling point organic solvents may be used as a mixture thereof. Furthermore, the dispersion method using polymers as disclosed in Japanese patent publication No. 39853/76 and Japanese patent application (OPI) No. 59943/76 may also be employed.

The base or base precursors may be mixed with an addition-polymerizable monomer described herein or an oligomer or polymer thereof.

The base or base precursor can be dispersed in binders hereinafter described. These binders may be used individually or in combination thereof. Hydrophilic binders are preferably used.

The oils to be used include high-boiling organic solvents which are used as solvents in emulsification and dispersion of hydrophobic compounds.

The hot-melt solvents which can be used are solid at ambient temperature but act as solvents upon melting in the vicinity of development temperatures and include urethanes, amides, pyridines, sulfonamides, sulfones, sulfoxides, esters, ketones and ethers whose melting points are not higher than 40° C. The hot-melt solvent is preferably used in an amount of from 0.1 to 50% by weight, and more preferably from 1 to 20% by weight, based on the total solid content of a light-sensitive layer.

The surface active agents which can be used include pyridinium salts, ammonium salts and phosphonium salts as described in Japanese patent application (OPI) No. 74547/84; polyalkylene oxides as described in Japanese patent application (OPI) No. 57231/84; and the like.

The compounds having interaction with silver or a silver ion include imides, nitrogen-containing heterocyclic compounds as described in Japanese patent application (OPI) No. 177550/84, thiols as described in Japanese patent application (OPI) No. 111636/84, thioureas, thioethers, and the like.

The above-described image formation accelerators can be incorporated in the light-sensitive material and/or the image-receiving material. The layer to which they may be added may be any of an emulsion layer, an intermediate layer, a protective layer and an image-receiving layer and layers adjacent to these layers. They are incorporated into the structures having a light-sensitive layer and an image-receiving layer on the same support in the same manner as described above.

These image formation accelerators may be used either alone or in combinations of two or more thereof. In general, use of combinations produces greater accelerating effects. In particular, a combined use of a base or a base precursor and other accelerators exerts significant accelerating effects.

In the present invention, various development stopping agents can be used for the purpose of ensuring constant image quality against variations in temperature and time of heat development. The development stopping agents as herein referred to are compounds that neutralize a base or react with a base to reduce a base concentration in the layer to thereby stop development, or compounds that mutually react with silver or a silver salt to suppress development. More specifically, the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxime esters as described, in e.g., in Japanese patent application (OPI) Nos. 108837/85 and 192939/85 and compounds which release acids through Lossen rearrangement as described in Japanese patent application (OPI) No. 230133/85. Examples of the electrophilic compounds which induce substitution reaction with bases upon heating include compounds disclosed in Japanese patent application (OPI) No. 230134/85.

The image-receiving element according to the present invention is an element in which a color image forming substance released from a light-sensitive element is fixed. It is provided on the same support as for the light-sensitive element, or it is provided on another support separately from the light-sensitive material having the light-sensitive element to form an image-receiving material.

The image-receiving element according to the invention can contain, if desired, at least one layer containing a mordant. When the image-receiving element is positioned on the surface, a protective layer may be provided thereon. If desired, the image-receiving element may be composed of two or more layers containing two or more mordants different in mordanting power from each other.

In the case of using a mordant as an image-receiving layer, it can be arbitrarily selected from those employed for diffusion transfer type light-sensitive materials. Among them, polymeric mordants are particularly preferred. The polymeric mordants include polymers containing a tertiary amino group, polymers containing a nitrogen-containing heterocyclic moiety, polymers containing a quaternary cation group derived from a tertiary amino group or a nitrogen-containing heterocyclic moiety, and the like.

The polymers containing vinyl monomer units having a tertiary amino group are described, e.g., in Japanese patent application (OPI) Nos. 60643/85 and 57836/85, etc.; and the polymers containing vinyl monomer units having a tertiary imidazole group are described, e.g., in Japanese patent application (OPI) Nos. 118834/85 and 122941/85, U.S. Pat. Nos. 4,282,305, 4,115,124 and 3,148,061, etc.

Preferred examples of the polymers containing vinyl monomer units having a quaternary imidazolium salt are set forth in British Pat. Nos. 2,056,101, 2,093,041 and 1,594,961, U.S. Pat. Nos. 4,124,386, 4,115,124, 4,273,853 and 4,450,224, Japanese patent application (OPI) No. 28225/73, etc.

In addition, preferred examples of the polymers containing vinyl monomer units containing a quaternary ammonium salt are described, e.g., in U.S. Pat. Nos. 3,709,609, 3,898,088 and 3,958,995, Japanese patent application (OPI) Nos. 57836/85, 60643/85, 122940/85 and 122942/85.

In the present invention, solvents can be used in the encapsulation of a polymerizable compound and a color image forming substance. Solvents may also be employed in the introduction of a reducing agent, a developer, etc., in a desired element. For example, a solution of a desired compound dissolved in water or a hydrophilic organic solvent can be directly coated on a support, if necessary, together with a binder, or can be introduced in a desired element according to the method as described in U.S. Pat. No. 2,322,027, or the like method. By the use of solvent in microcapsules, the degree of capsule rupture caused by pressure application and the amount of a color image forming substance within capsules to be transferred to an image-receiving element can be controlled. The amount of the solvent to be used in the microcapsules preferably ranges from 1 to 500 parts by weight per 100 parts by weight of a polymerizable compound.

The solvents to be used in the present invention include natural oils and synthetic oils, either individually or in combination. Specific examples of these solvents are cottonseed oil, kerosine, aliphatic ketones, aliphatic esters, paraffin oil, naphthenic oil, alkylated biphenyls, alkylated terphenyls, diarylethanes (e.g., 1-phenyl-1-xylylethane, 1-phenyl-1-phenyl-1-p-ethylphenylethane, 1,1'-ditolylethane, etc.), alkyl phthalates (e.g., dibutyl phthalate, dioctyl phthalate, etc.), phosphoric esters (e.g., diphenyl phosphate, tribphenyl phosphate, tricresyl phosphate, dioctylbutyl phosphate, etc.), citric esters (e.g., acetyl tributyl citrate, etc.), benzoic esters (e.g., octyl benzoate, etc.), alkylamides (e.g., diethyllaurylamide, etc.), fatty acid esters (e.g., dibutoxyethyl succinate, dioctyl azelate, etc.), trimesic esters (e.g., tributyl trimesate, etc.), lower alkyl acetates (e.g., ethyl acetate, butyl acetate, etc.), ethyl propionate, sec-butyl alcohol, methyl isobutyl ketone, $\beta$-ethoxyethyl acetate, methyl cellosolve acetate, cyclohexanone, and the like.

Binders which can be used in the light-sensitive materials and image receiving materials of the present invention typically include transparent or semi-transparent hydrophilic binders, for example, natural substances, such as proteins, e.g., gelatin, gelatin derivatives cellulose derivatives, etc., and polysaccharides, e.g., starch, gum arabic, etc.; and synthetic polymeric substances, such as water-soluble polyvinyl compounds, e.g., polyvinylpyrrolidone, acrylamide polymers, etc. In addition, vinyl compounds dispersed in the form of latex, which are particularly effective to increase dimensional stability of photographic materials, can also be used. These binders may be used alone or in combinations thereof.

Supports to be used in the light-sensitive materials and image-receiving materials of the present invention should withstand heat at the processing temperature. Generally employed supports include glass, paper, fine paper, synthetic paper, metals and analogues thereof; acetyl cellulose films, cellulose ester films, polyvinyl acetal films, polystyrene films, polycarbonate films, polyethylene terephthalate films and other films and resin materials related thereto. Paper supports laminated with polymers, e.g., polyethylene, can also be used. Polyester films as described in U.S. Pat. Nos. 3,634,089 and 3,725,070 are preferably employed.

If desired, the light-sensitive materials according to the present invention can be coated with a protective layer, an intermediate layer, an antistatic layer, an anticurl layer, a release layer, a matting agent layer, or a like auxiliary layer. In particular, the protective layer preferably contains an organic or inorganic matting agent for the purpose of preventing adhesion.

The light-sensitive material and the image-receiving material may contain, if desired, antifoggants, fluorescent brightening agents, discoloration inhibitors, antihalation dyes, anti-irradiation dyes or pigments (inclusive of white pigments, e.g., titanium oxide), water releasers to release water during heating, thermal polymerization inhibitors, surface active agents, hot-melt solvents to assist the transfer of the substances in the reaction system which are solid at ordinary temperature and are in melted state when heated, and the like.

A latent image is obtained by imagewise exposure to radiation including visible light. Various exposure means can be used in the present invention, and, in general, commonly employed light sources may be used, such as sunlight, flash light sources, e.g., an electronic flash and a flash bulb, a tungsten lamp, a mercury lamp, a halogen lamp, e.g., an iodine lamp, a xenon lamp, a laser ray, a CRT, a plasma light source, a fluorescent lamp, a light-emitting diode, etc. In addition, a combination of a micro-shutter array utilizing LCD (liquid crystal display) or PLZT (lanthanum-doped lead zirconate titanate) and a linear or planar light source may also be used. The type of light source used and the exposure can be selected depending on the light-sensitive wavelengths due to spectral sensitization of silver halides or sensitivity.

Originals which can be applied to the present invention may be either monochromatic images or color images, and include line images, such as drawings, as well as photographic images having a continuous tone. The light-sensitive materials of the invention can also be used for taking a picture of a portrait or a scene by the use of a camera. Printing from an original can be carried out by contact printing or reflex printing by intimately contacting the light-sensitive material to the original or by enlarging printing.

It is also possible to print images photographed by a video camera, etc., or image information transmitted from a TV station by directly displaying these images by CRT or FOT (Fiber Optical Tube) and converting the resulting signals to an image on the light-sensitive material by contact printing or printing through a lens.

Light-emitting diodes (LED), recently being remarkable developed, have seen increasing utility as an exposure means or a display means in a wide variety of apparatuses. However, it has been difficult to produce an LED which can effectively emit blue light. Such being the case, color images can be reproduced by using three kinds of LEDs, emitting green light, red light, and infrared light, respectively, and designing the light-sensitive material in such a manner that the emulsion layers sensitive to these lights contains a yellow, magenta, and cyan image forming substance, respectively. More specifically, the light-sensitive material is so designed that the green-sensitive emulsion layer contains a yellow image forming substance, the red-sensitive emulsion layer contains a magenta image forming substance, and the infrared-sensitive emulsion layer contains a cyan image forming substance. If desired, other combinations of a light-sensitive emulsion layer and an image forming substance may also be applied.

In addition to the above-described exposure processes by directly contacting an original with the light-sensitive material or projecting the original on the light-sensitive material, image formation can be effected by a process which comprises putting an original irradiated by a light source into memory of a readout computer, etc., through a receptor element, e.g., a phototube, a CCD (charge-coupling device), etc., processing the memorized information as necessary (i.e., image processing), reproducing the image information in a CRT, and utilizing it as an imagewise light source, or a process which comprises directly causing three kinds of LEDs to emit light according to the informations processed as described above.

The exposure employed in these processes varies depending on the kind or degree of sensitization of silver halides used.

Heating after the imagewise exposure can be conducted in a known manner, for example, by directly contacting the light-sensitive material with a hot plate or drum, or by passing the light-sensitive material using a heat roller. Heating may be effected by using air heated to high temperatures, high frequency radiation, or a laser beam. An infrared heater may also be used for heating some kinds of light-sensitive materials. Further, heating may be effected by utilizing eddy currents generated by electromagnetic induction. The light-sensitive material may be heated in a bath of a heated liquid inert to the material, for example, a fluorine-containing liquid.

In addition to the above-described heating means, heating may be carried out by incorporating a heat source in light-sensitive materials as disclosed in Japanese Patent Application No. 135568/85. For example, a layer comprising conductive particles, such as carbon black or graphite, i.e., a conductive film, may be provided in the light-sensitive material, and electricity is passed therethrough to generate Joule's heat.

Heating temperatures for the light-sensitive materials of the present invention usually ranges from 80° to 200° C., and preferably from 100° to 160° C. Various heating patterns are applicable. For example, a method of heating at a constant temperature is most commonly employed. According to the characteristics of the light-sensitive material to be processed, a method of multi-stage heating which comprises, for example, heating the light-sensitive material at a high temperature for a short period of time, followed by gradually lowering the heating temperature, is effectively employed. In this case, the heating time is usually from 1 second to 5 minutes, and preferably from 5 seconds to 1 minute.

In cases where the light-sensitive material is susceptible to air oxidation upon heating, it is effective that the air in the surroundings is degassed or replaced with an inert gas. The surface of the light-sensitive material may be brought into direct contact with a heating surface or be exposed to air. In the case where development is carried out with the surface of the light-sensitive material being exposed to air, it is effective to conduct heating under a cover for the purpose of preventing evaporation of volatile components or preserving the heat.

The light-sensitive material according to the present invention contains a light-sensitive silver halide as a photo-sensor and the hydrazine derivative of formula (I) so that a color image forming substance is immobilized by imagewise exposure to light, followed by heat development, to thereby provide a color image simply, easily and rapidly. Moreover, the light-sensitive material of the invention exhibits high sensitivity to provide a color image through exposure for a short time.

This invention is now illustrated in greater detail with reference to the following examples, but it should be understood that they are not intended to limit the present invention.

EXAMPLE 1

(1) Preparation of Light-Sensitive Element

Preparation of Silver Chlorobromide Emulsion:

In 100 ml of water were dissolved 20 g of gelatin and 3 g of sodium chloride, and the solution was kept at 75° C. while stirring. To this gelatin aqueous solution, 600 ml of an aqueous solution containing sodium chloride and potassium bromide and 600 ml of an aqueous solution containing 0.59 mol of silver nitrate were added simultaneously at the same feed rate over a period of 40 minutes. There was obtained a monodisperse emulsion of cubic silver chlorobromide grains having a mean grain size of 0.35 μm and a bromide content of 80 mol%.

After washing for desalting, the emulsion was subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of Silver Benzotriazole Emulsion:

In 3000 ml of water were dissolved 28 g of gelatin and 13.2 g of benzotriazole, and the solution was kept at 40° C. under stirring. A solution of 17 g of silver nitrate in 100 ml of water was added to the above solution over a period of 2 minutes. The excess salt was sedimented and removed by pH adjustment. The emulsion was then adjusted to a pH of 6.30 to obtain 400 g of a silver benzotriazole emulsion.

Preparation of Dispersion of Color Image Forming Substance:

Trimethylolpropane triacrylate (1.8 g), 1 g of Pargascript Red I-6-B (produced by Ciba Geigy) having the following formula and 2 ml of methylene chloride were mixed to form a solution. The resulting solution was mixed with a 10 wt% aqueous solution of polyvinyl alcohol (degree of polymerization: 500) containing 0.1 g of sodium dodecylbenzenesulfonate with stirring, followed by emulsification in a homogenizer at 15,000 rpm for 6 minutes to obtain a dispersion of a color image forming substance having a mean particle size of 0.4 μm.

Pargascript Red I-6-B

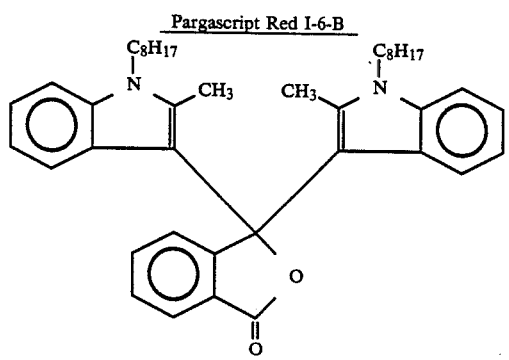

Preparation of Light-Sensitive Element:

Ten grams of the silver chlorobromide emulsion, 24 g of the silver benzotriazole emulsion, and 30 g of the dispersion of the color image forming substance were mixed with stirring, and 9 ml of a 5 wt% aqueous solution of Emulex NP-8 (produced by Nippon Emulsion K.K.) having the following formula was added thereto, followed by mixing at 40° C. for 1 minute. To the mixture were then added 20 ml of a 5 wt% triethanolamine aqueous solution and 28 ml of a 5 wt% solution of Hydrazine Derivative D-1 in cyclohexanone to prepare a coating composition. The resulting coating composition was coated on a polyethylene terephthalate film to a wet thickness of 50 μm and dried to prepare Light-Sensitive Emulsion (A).

Emulex NP-8

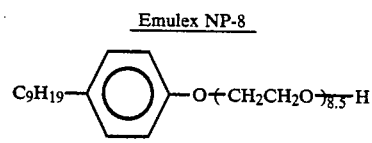

Light-Sensitive Elements (B), (B'), (C), and (C') were prepared in the same manner as for (A), except using Hydrazine Derivative D-2 or D-39 in an amount indicated in Table 1 in place of D-1.

2. Preparation of Image-Receiving Element

To 125 g of water was added 11 g of a 40 wt% aqueous solution of sodium hexametaphosphate, and further added thereto were 34 g of zinc 3,5-di-α-methylbenzylsalicylate and 82 g of a 55 wt% slurry of calcium carbonate, followed by coarsely dispersing in a mixer. The coarse dispersion was then finely dispersed in a dynamic dispersing machine. To 200 g of the resulting dispersion were added 6 g of a 50 wt% latex of SBR (styrene-butadiene rubber) and 55 g of a 8 wt% polyvinyl alcohol aqueous solution, followed by uniform mixing. The resulting mixture was uniformly coated on coat paper having a basis weight of 43 g/m² to a wet thickness of 30 μm and dried to prepare an image-receiving element.

3. Evaluation of Light-Sensitive Material

Each of the above prepared light-sensitive materials was imagewise exposed to light using a tungsten lamp at 200 lux for 1 second and then heated on a hot plate heated at 140° C. for 30 seconds. The light-sensitive material was then brought into contact with the above prepared image-receiving element and passed through press rolls under a pressure of 350 kg/cm², whereby a clear magenta positive image was obtained on the image-receiving element in correspondence to the unexposed area. The maximum and minimum densities of the image are shown in Table 1.

TABLE 1

| Light-Sensitive Element | Hydrazine Derivative | | Maximum Density | Minimum Density |
|---|---|---|---|---|
| | Kind | Amount | | |
| (A) | D-1 | 5 wt % cyclohexanone solution; 28 ml | 1.52 | 0.31 |
| (B) | D-2 | 6 wt % cyclohexanone solution; 30 ml | 1.55 | 0.33 |
| (B') | D-2 | 6 wt % cyclohexanone solution; 36 ml | 1.50 | 0.29 |
| (C) | D-39 | 7.5 wt % cyclohexanone solution; 36 ml | 1.57 | 0.39 |
| (C') | D-39 | 7.5 wt % cyclohexanone solution; 42 ml | 1.54 | 0.31 |

EXAMPLE 2

Preparation of Microcapsules and Light-Sensitive Element:

In 15 g of trimethylolpropane triacrylate were dissolved 0.06 g of a polymer (P-1) of the following formula and 0.9 g of Pargascript Red 1-6-B, and to the solution were added 1.0 g of the silver chlorobromide emulsion of Example 1, 2.4 g of the silver benzotriazole emulsion of Example 1, 0.5 ml of a 10 wt% aqueous solution of Emulex NP-8, 0.25 ml of a 40 wt% aqueous solution of triethanolamine and 3.6 ml of a 7.5 wt% cyclohexanone solution of Hydrazine Derivative D-36. The mixture was dispersed in a homogenizer for 3 minutes at 18,000 rpm. To the dispersion was added 0.15 g of Millionate MR-100 (produced by Nippon Polyurethane Industry Co., Ltd.), followed by stirring for 1 minute at 3,000 rpm. Four grams of Takenate D-110N (produced by Takeda Chemical Industries, Ltd.) were further added thereto, followed by stirring for 1 minute at 3,000 rpm.

The resulting solution was added to a mixture of 30 g of a 4 wt% aqueous solution of methyl cellulose and 15 g of water, and the mixture was emulsion-dispersed in a homogenizer for 1 minute at 6,000 rpm. To the dispersion was added 45 g of water, and the mixture was heated at 60° C. for 1 hour while stirring to prepare a coating composition.

The coating composition was coated on a polyethylene terephthalate film to a wet thickness of 30 μm and dried to obtain Light-Sensitive Element (D).

Light-Sensitive Element (D') was prepared in the same manner as for (D), except changing the amount of the hydrazine derivative to be added as indicated in Table 2. Polymer P-1:

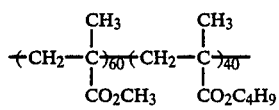

(The numbers 60 and 40 indicate mol%)

These light-sensitive elements were evaluated in the same manner as described in Example 1, and the results obtained are shown in Table 2.

TABLE 2

| Light-Sensitive Element | Hydrazine Derivative | | Maximum Density | Minimum Density |
| --- | --- | --- | --- | --- |
| | Kind | Amount | | |
| (D) | D-39 | 7.5 wt % cyclohexanone solution; 3.6 ml | 1.44 | 0.52 |
| (D') | D-39 | 7.5 wt % cyclohexanone solution; 4.2 ml | 1.39 | 0.48 |

It can be seen from these results that the light-sensitive materials according to the present invention provide a color image simply, easily, and rapidly through a dry process including heating as compared with the conventional light-sensitive materials that are wet-processed. It can further be seen that a color image having sufficient density can be obtained by exposure for a short exposure time, which indicates high sensitivity of the light-sensitive materials according to the present invention.

While the invention has been described in detail and with reference to specific embodiments thereof, it will be apparent to one skilled in the art that various changes and modifications can be made therein without departing from the spirit and scope thereof.

What is claimed is:

1. A light-sensitive material comprising a support having provided thereon a light-sensitive layer containing at least a light-sensitive silver halide, a polymerizable compound, a color image forming substance, and a hydrazine derivative represented by formula (I)

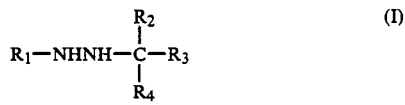

wherein
$R_1$ represents a monovalent group derived from a substituted or unsubstituted aromatic ring or aromatic heterocyclic ring; $R_2$ and $R_3$ each represents a substituted or unsubstituted aryl group; and $R_4$ represents a hydrogen atom or a substituted or unsubstituted alkyl, aryl, alkoxycarbonyl, or carbamoyl group, in which the color image forming substance is immobilized by imagewise exposure to light followed by heat development, whereby the color image forming substance is immobilized through polymerization or crosslinking of the polymerizable compound, under conditions substantially not containing water, wherein said silver halide forms a latent image upon exposure to light, and thus formed latent image acts as a catalyst to cause an oxidation-reduction between the silver halide and said hydrazine derivative.

2. A light-sensitive material as in claim 1, wherein at least said polymerizable compound, and said color image forming substance are incorporated into the same oil droplets or microcapsules.

3. A light-sensitive material as in claim 1, wherein said light-sensitive layer further contains a hot-melt solvent.

4. A light-sensitive material as in claim 3, wherein said hot-melt solvent is present in an amount of from 0.1 to 50% by weight based on the total solid content of said light-sensitive layer.

5. A light-sensitive material as in claim 1, wherein said light-sensitive layer further contains a base or a base precursor.

6. A light-sensitive material as in claim 1, wherein said base or base precursor is present in a total amount not more than 50% by weight based on the total solid content of said light-sensitive layer.

7. A light-sensitive material as in claim 1, wherein said light-sensitive layer further contains an organic silver salt oxidizing agent.

8. A light-sensitive material as in claim 7, wherein said organic silver salt oxidizing agent is present in an amount of from 0.01 to 10 mols per mol of the light-sensitive silver halide.

9. A light-sensitive material as in claim 1, wherein said color image forming substance is a dye or a pigment.

10. A light-sensitive material as in claim 1, wherein said color image forming substance is one of two components capable of developing a color upon reaction therebetween.

11. A light-sensitive material as in claim 1, wherein said color forming substance is selected from triarylmethanes, diphenylmethanes, xanthenes, thiazines, and spiropyrans capable of developing a color upon reacting with a developer.

12. A light-sensitive material as in claim 1, wherein said light-sensitive silver halide is present in an amount of from 1 mg to 10 g per m² (silver content), said polymerizable compound is present in an amount of from 5 to $1.2 \times 10^5$ parts by weight per part by weight of the silver halide, said color image forming substance is present in an amount of from 0.5 to 50 parts by weight per 100 parts by weight of the polymerizable compound, and said hydrazine derivative represented by formula (I) is present in an amount of from 0.01 to 50 mol% per mol of the polymerizable compound.

13. A light-sensitive material as in claim 2, wherein said oil droplets or microcapsules further contain a light-sensitive silver halide.

14. A light-sensitive material as in claim 1, wherein said hydrazine derivative is present in an amount of from 10 to 300 mol% per mol of silver in the light-sensitive silver halide.

15. A light-sensitive material as in claim 1, wherein the amount of the hydrazine derivative is from 0.1 to 20 mol% per mol of polymerizable compound.

16. A light-sensitive material as in claim 14, wherein the amount of the hydrazine derivative is from 0.1 to 20 mol% per mol of polymerizable compound.

17. A light-sensitive material as in claim 1, wherein said heat development is conducted at a temperature of from 80° to 200° C. so as to polymerize said polymerizable compound in the area having a latent image of light-sensitive silver halide in the light-sensitive material.

* * * * *